United States Patent
TIng et al.

(10) Patent No.: US 9,449,971 B2
(45) Date of Patent: Sep. 20, 2016

(54) METHODS OF FORMING FINFETS

(71) Applicant: Taiwan Semiconductor Manufacturing Company, Ltd., Hsin-Chu (TW)

(72) Inventors: Kuo-Chiang TIng, Hsin-Chu (TW); Jyh-Huei Chen, Hsin-Chu (TW); Wen-Huei Guo, Chu-bei (TW); Cheng-Han Wu, Hsin-Chu (TW); Yu-Wei Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/557,261

(22) Filed: Dec. 1, 2014

(65) Prior Publication Data
US 2016/0155739 A1  Jun. 2, 2016

(51) Int. Cl.
| | |
|---|---|
| *H01L 35/24* | (2006.01) |
| *H01L 51/00* | (2006.01) |
| *H01L 27/088* | (2006.01) |
| *H01L 29/06* | (2006.01) |
| *H01L 21/8234* | (2006.01) |
| *H01L 29/66* | (2006.01) |

(52) U.S. Cl.
CPC ... *H01L 27/0886* (2013.01); *H01L 21/823431* (2013.01); *H01L 21/823437* (2013.01); *H01L 21/823481* (2013.01); *H01L 29/0653* (2013.01); *H01L 29/6656* (2013.01); *H01L 29/6681* (2013.01)

(58) Field of Classification Search
CPC ..... H01L 35/24; H01L 51/00; H01L 27/115; H01L 27/7881; H01L 29/66825; H01L 29/42348
USPC .......................................... 257/401
See application file for complete search history.

(56) References Cited

U.S. PATENT DOCUMENTS

| | | | | |
|---|---|---|---|---|
| 2004/0079988 | A1* | 4/2004 | Harari | G11C 16/0483 257/316 |
| 2015/0214235 | A1* | 7/2015 | Lee | H01L 21/28273 257/316 |
| 2015/0243653 | A1* | 8/2015 | Hsiao | H01L 27/088 257/401 |
| 2015/0255299 | A1* | 9/2015 | Cantone | H01L 21/3086 438/702 |
| 2015/0311342 | A1* | 10/2015 | Lin | H01L 29/7851 257/190 |

* cited by examiner

*Primary Examiner* — Phuc Dang
(74) *Attorney, Agent, or Firm* — Slater Matsil, LLP

(57) ABSTRACT

An embodiment is a method including forming a first fin on a substrate, the first fin having a first longitudinal axis, forming a first trench having a first width in the first fin, the first trench dividing the first fin into at least two fin portions, forming a first gate structure and first source/drain regions over one of the at least two fin portions of the first fin, and forming a second gate structure and second source/drain regions over another of the at least two fin portions of the first fin.

20 Claims, 17 Drawing Sheets

METHODS OF FORMING FINFETS

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (FinFETs) have been studied to overcome some of these problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
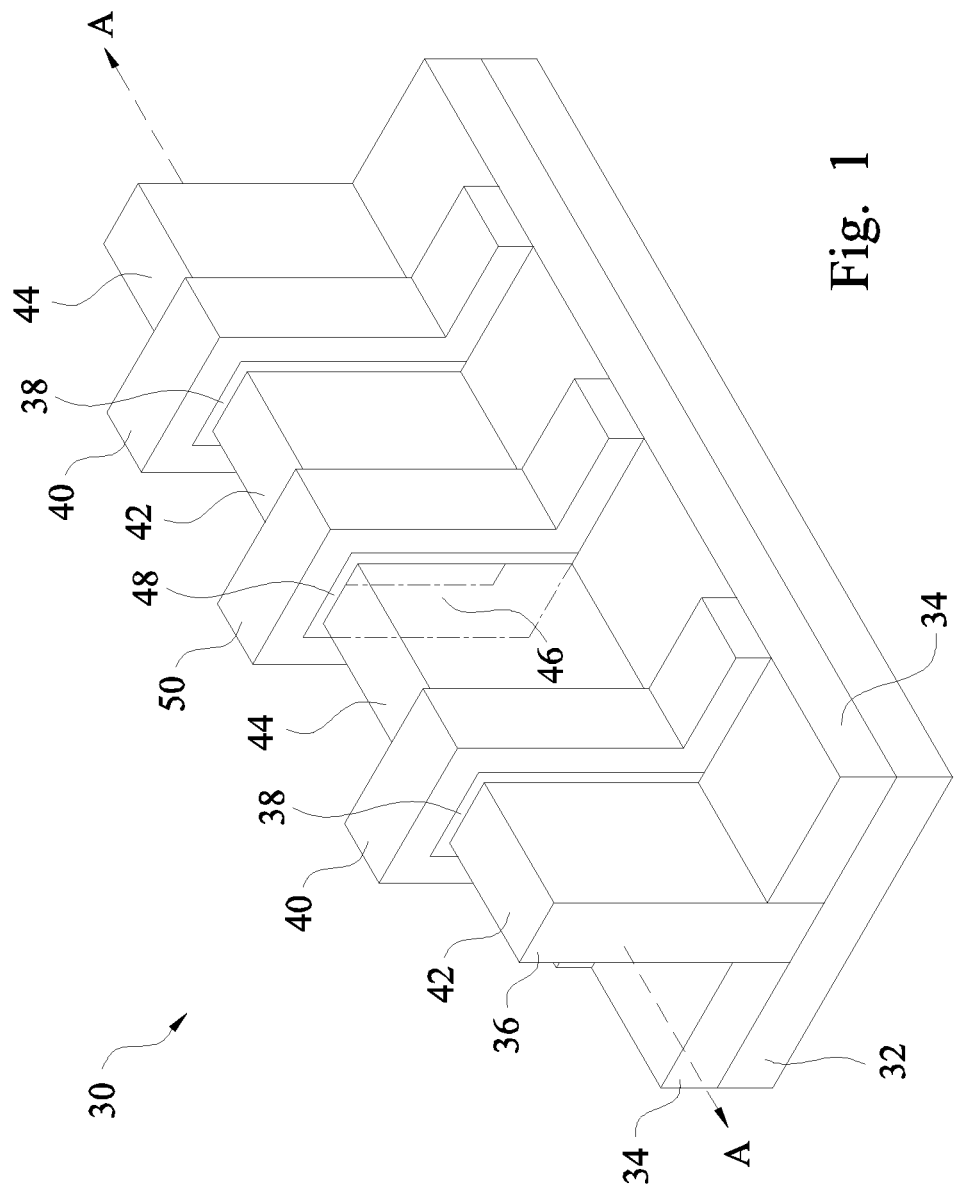
FIG. 1 is an example of a Fin Field-Effect Transistor (FinFET) in a three-dimensional view in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last process. In other embodiments, a gate-first process may be used. Also, some embodiments contemplate aspects used in planar devices, such as planar FETs. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIG. 1 illustrates an example of a FinFET 30 in a three-dimensional view. In an embodiment, the FinFET 30 includes multiple FinFET structures along fins that are isolated from each other by isolation regions in the fins.

The FinFET 30 comprises a fin 36 on a substrate 32. The substrate 32 includes isolation regions 34, and the fin 36 protrudes above and from between neighboring isolation regions 34. Gate dielectrics 38 are along sidewalls and over a top surface of the fin 36, and gate electrodes 40 are over the gate dielectrics 38. A dummy gate dielectric 48 is along sidewalls and over a top surface of the fin 36, and a dummy gate electrode 50 is over the dummy gate dielectric 48. A fin isolation region 46 is formed in the fin 36 under the dummy gate dielectric 48 and the dummy gate electrode 50 such that the dummy gate dielectric 48 directly adjoins at least a portion of the fin isolation region 46. The dummy gate dielectric 48 and the dummy gate electrode 50 are between the gate dielectrics 38 and the gate electrodes 40. Source/drain regions 42 and 44 are disposed in opposite sides of the fin 36 with respect to the gate dielectrics 38 and the gate electrodes 40. The fin isolation region 46, the dummy gate dielectric 48, and the dummy gate electrode 50 are interposed between source/drain regions 42 and 44 of adjacent FinFET structures of the FinFET 30. FIG. 1 further illustrates a reference cross-section that is used in later figures. Cross-section A-A is along a longitudinal axis of the fin 36 and in a direction of, for example, a current flow between the source/drain regions 42 and 44. Subsequent figures refer to this reference cross-section for clarity.

Figure 2A:
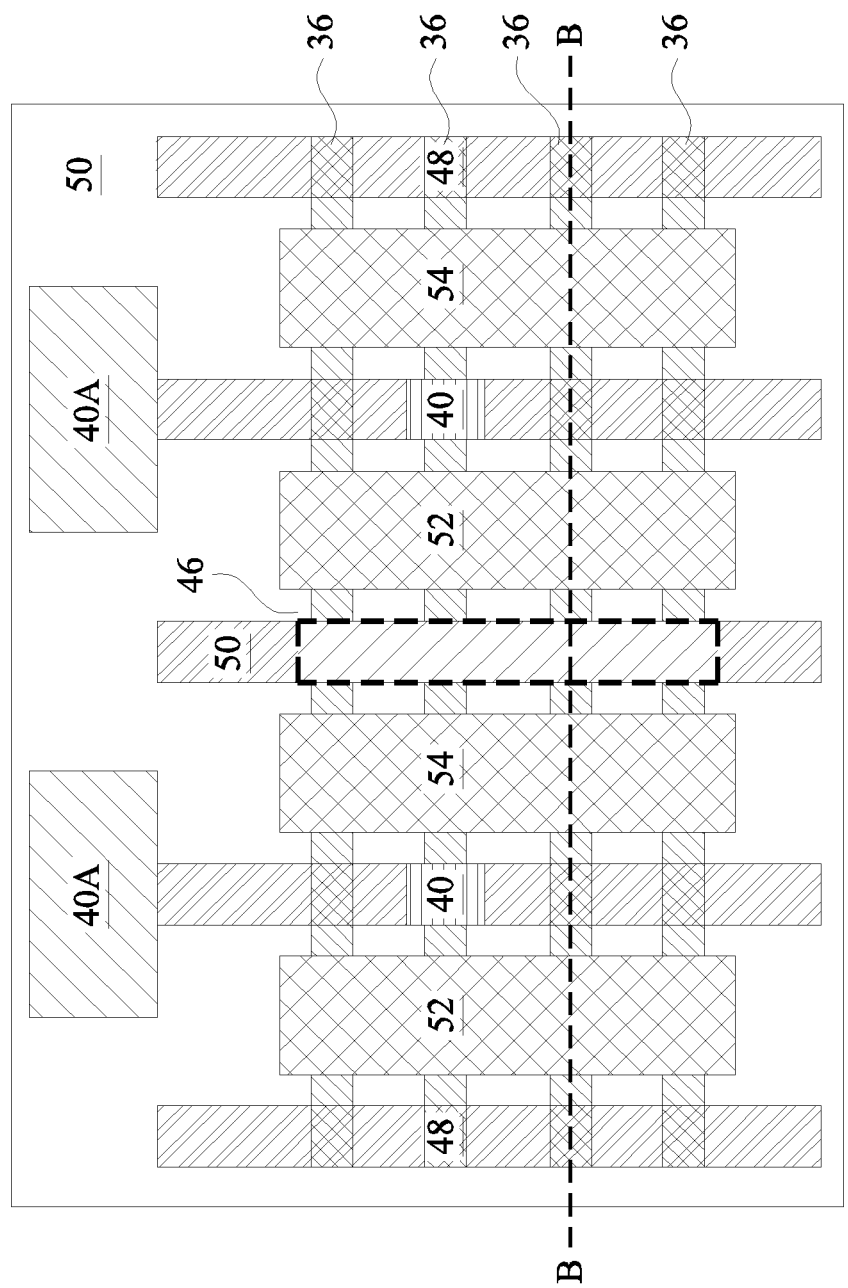
FIGS. 2A and 2B are a plan view and a cross-sectional view, respectively, of a FinFET in accordance with some embodiments.
Figure 2B:
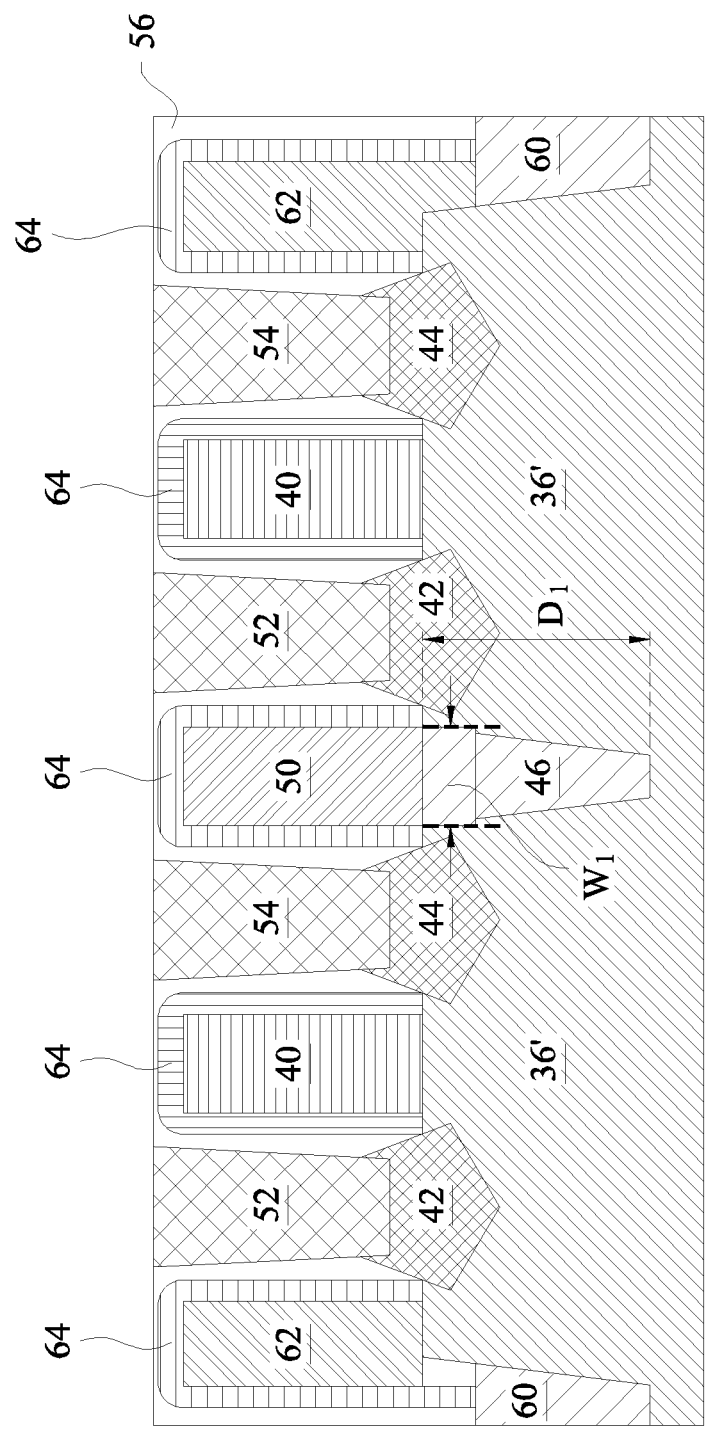

FIGS. 2A and 2B are a plan view and a cross-sectional view, respectively, of a FinFET in accordance with some embodiments with FIG. 2B being along cross-section B-B in FIG. 2A which is a similar cross-section as cross-section A-A in FIG. 1.

FIGS. 2A and 2B illustrate a plurality of fins 36, isolation regions 46 and 60, source/drain regions 42 and 44, contacts 52 and 54, gate electrodes 40, gate contact pads 40A, dummy gate electrodes 50 and 62, gate spacers 64, and an inter-layer dielectric (ILD) 56. The fins 36 may be a part of a substrate (not shown, see 32 in FIG. 1). The substrate may be a semiconductor substrate, a bulk semiconductor, a semiconductor-on-insulator (SOI) substrate, or the like, which may be doped (e.g., with a p-type or an n-type dopant) or undoped. The substrate may be a wafer, such as a silicon wafer. The fins 36 may be surrounded by isolation regions such as shallow trench isolation (STI) regions (not shown). The fins 36 and the STI regions may be formed by etching the substrate 32 to form trenches (not shown), and filling the trenches with a dielectric material to form the STI regions. The STI regions may be formed of an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In an embodiment, the insulation material is silicon oxide formed by a FCVD process. An anneal process may be performed once the insulation material is formed. The portion of substrate 32 between neighboring STI regions is referred to as semiconductor strips 36. The top surfaces of the semiconductor strips 36 and the top surfaces of the STI regions may be substantially level with each other, such as by performing a chemical mechanical polish (CMP) after depositing the material of the STI regions, although the surfaces may be at slightly different levels.

The STI regions may then be recessed have portions of the semiconductor strips 36 extend above the top surfaces of the STI regions. The protruding portions of the semiconductor strips 36 will be referred to as fins 36 hereinafter.

The fins 36 may have one or more fin isolation regions 46 that divide a single fin 36 into several fin portions 36'. The fin isolation regions 46 isolate the separate fin portions 36' to allow the devices (e.g. gate electrodes 40, source/drain regions 42 and 44, etc.) to operate independently of each other such that more independent devices may be formed in a smaller area. The fin isolation regions 46 may be formed at various steps of the formation of the device as discussed below in the various embodiments. As discussed in more detail below, the fin portions 36' were formed as a single fin 36, which was subsequently divided into multiple fin portions 36' by the fin isolation regions 46. It has been discovered that this fin isolation approach saves approximately 3% of substrate space in a device/die at the 16 nm technology node as compared to other approaches.

The formation of the fin isolation regions 46 may include etching the fins 36 to form trenches (not shown), and filling the trenches with a dielectric material to form the fin isolation regions 46. In an embodiment, the fin isolation regions 46 are formed to have a width $W_1$ in a range from about 30 nm to about 50 nm, and to have a depth $D_1$ in a range from about 70 nm to about 130 nm. In some embodiments, the width W1 is less than the gate pitch between adjacent gate electrodes 40, 50, and 62. The fin isolation regions 46 may be formed of an oxide, such as silicon oxide, a nitride, the like, or a combination thereof, and may be formed by HDP-CVD, FCVD (e.g., a CVD-based material deposition in a remote plasma system and post curing to make it convert to another material, such as an oxide), atomic layer deposition (ALD), plasma-enhanced ALD (PEALD), the like, or a combination thereof. Other insulation materials formed by any acceptable process may be used. In an embodiment, the insulation material is silicon oxide formed by a FCVD process. An anneal process may be performed once the insulation material is formed.

A person having ordinary skill in the art will readily understand that the process described with respect to FIGS. 2A-B is just one example of how fins 36 may be formed. In other embodiments, a dielectric layer can be formed over a top surface of the substrate 32; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 36 in FIGS. 2A-B can be recessed, and a material different from the fins 36 may be epitaxially grown in their place. In an even further embodiment, a dielectric layer can be formed over a top surface of the substrate 32; trenches can be etched through the dielectric layer; heteroepitaxial structures can be epitaxially grown in the trenches using a material different from the substrate 32; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material in an NMOS region different from the material in a PMOS region. In various embodiments, the fins 36 may comprise silicon germanium ($Si_x Ge_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

The dummy gate electrode 50 is formed over the fin isolation region 46. The dummy gate electrode 50 helps to provide a more uniform pattern density and also helps to control the epitaxial growth of the adjacent source/drain regions 42 and 44 in the fin portions 36'. In an embodiment, sidewalls of the dummy gate electrode 50 are substantially aligned with sidewalls of the fin isolation region 46. The dummy gate electrode 50 is a floating gate and does not have any control voltage applied to it.

The fin portions 36' have gate electrodes 40 over top surfaces and sidewalls of the fin portions 36' with source/drain regions 42 and 44 on opposing sides of each of the gate electrodes 40. The gate electrodes 40 may have gate contact pads 40A to provide contact pads for overlying contacts (not shown). The outer ends of the fin portions 36' also have dummy gate electrodes 62 formed partially on the fin portions 36' and partially on isolation regions 60. The dummy gate electrodes 62 help to provide a more uniform pattern density and also help to control the epitaxial growth of the adjacent source/drain regions 42 and 44 in the fin portions 36'. The isolation regions 60 may isolate the ends of fin 36 from an end of an adjacent fin that has a substantially collinear longitudinal axis to the fin 36. In an embodiment, the width $W_1$ of the fin isolation region 46 is smaller than a width, measured in the same direction as width $W_1$, of the isolation regions 60, and the depth $D_1$ of the fin isolation region 46 is smaller than a depth, measured in the same direction as depth $D_1$, of the isolation regions 60.

The gate electrodes 40 and the dummy gate electrodes 50 and 62 include a gate dielectric layer (not shown). These gate structures cross over a plurality of the fins 36 and the isolation regions 46, 60, and other isolation regions between the fins 36. These gate structures have longitudinal axes that are substantially perpendicular to the longitudinal axes of fins 36. In some embodiments, the gate structure including the gate electrode 40 is also a dummy gate structure and will be replaced with a replacement gate structure using a "gate-last" or replacement-gate process. In other embodiments, the gate structure including the gate electrode 40 is an active gate and is formed in a "gate-first process" and will not be replaced.

A gate dielectric layer (not shown) may be formed and patterned to form the gate dielectrics (not shown). The gate dielectric layer may be formed over the fins 36 and the isolation regions 46 and 60 by thermal oxidation, in-situ steam generation (ISSG) process, chemical vapor deposition (CVD), a spin-on-glass process, sputtering, or any other methods known and used in the art for forming a gate dielectric layer. In some embodiments, the gate dielectric layer may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

After the gate dielectric layer is formed, the gate electrodes 40, 50, and 62 are formed over the gate dielectric layer. The gate electrodes 40, 50, and 62 may be formed by first forming a gate electrode layer (not shown) over the fins 36 and the isolation regions 46 and 60 and then patterning the gate electrode layer to form the gate electrodes 40, 50, and 62. In some embodiments, the gate electrode layer is a conductive material and may be selected from a group comprising polycrystalline-silicon (poly-Si), poly-crystalline silicon-germanium (poly-SiGe), metallic nitrides, metallic silicides, metallic oxides, and metals. In an embodiment, the gate electrode layer includes a metal-containing material such as TiN, TaN, TaC, Co, Ru, Al, combinations thereof, or multi-layers thereof. The gate electrode layer may be deposited by CVD, physical vapor deposition (PVD), sputter deposition, or other techniques known and used in the art for depositing conductive materials. The top surface of the gate electrode layer may have a non-planar top surface and may be planarized by, for example, performing a CMP process after it is deposited. A mask layer—such as a photoresist, hard mask, combinations thereof, or multi-layers thereof—may be formed and patterned over the gate electrode layer. The patterned mask layer may then be transferred to the material of the gate electrode layer using acceptable photolithography and etching techniques to form the gate electrodes 40, 50, and 62.

Gate spacers 64 may be formed on sidewalls of the gate electrodes 40, 50, and 62. The gate spacers 64 may be formed on opposite sides of the gate electrodes 40, 50, and 62. The gate spacers 64 may be formed by blanket depositing a spacer layer (not shown) on the previously formed structure. In an embodiment, the gate spacers may include a spacer liner (not shown) comprising SiN, SiC, SiGe, oxynitride, oxide, combinations thereof, or the like. The spacer layer may comprise SiN, oxynitride, SiC, SiON, oxide, combinations thereof, or the like and may be formed by methods utilized to form such a layer, such as CVD, plasma enhanced CVD, sputter, and other methods known in the art. The gate spacers are then patterned, for example, by anisotropically etching to remove the spacer layer from the horizontal surfaces of the structure.

The source/drain regions 42 and 44 may be formed in the fins 36. The source/drain regions 42 and 44 may be doped by with the appropriate dopants to complement the dopants in the fins 36. In another embodiment, the source/drain regions may be formed by forming recesses in the fins 36 and epitaxially growing material in the recesses. The source/drain regions 42 and 44 regions may be doped either through an implantation method, or else by in-situ doping as the material is grown.

The source/drain regions 42 and 44 may comprise and a heavily doped region and lightly doped regions. In this embodiment, the lightly doped regions are formed before the gate spacers 64, and after the gate spacers are formed, the source/drain regions 42 and 44 may then be heavily doped. This forms lightly doped regions and heavily doped regions. The lightly doped regions are primarily underneath the gate spacers 64 while the heavily doped regions are outside of the gate spacers 64 along the fins 36. In some embodiments, the fins 36 include an anti-punch through region (not shown). This anti-punch through region prevents the short channel effect of electrons or holes punching through the channel from the source to the drain. The anti-punch through region may be doped the same as the fin 36 but with a higher dopant concentration. In some embodiments, the fin portions 36' adjoining a fin isolation region 46 are doped with the same dopants and source/drain regions 42 and 44 in these fin portions 36' are doped with the same dopants.

After the formation of the source/drain regions 42 and 44 and the gate spacers 64, an etch stop layer (ESL) (not shown) and an inter-layer dielectric (ILD) 56 may be formed over and adjoining the gate electrodes 40, 50, and 62 and the fins 36. The ESL and the ILD 56 may be formed over the gate spacers 64, the gate electrodes 40, 50, and 62, the source/drain regions 42 and 44, the fins 36, and the isolation regions 46, 60, and other isolation regions not shown in FIGS. 2A and 2B. The ESL may be conformally deposited over components on the substrate. In an embodiment, the ESL is formed of SiN, SiCN, SiON, the like, or a combination thereof and is formed by ALD, molecular layer deposition (MLD), a furnace process, CVD, PECVD, the like, or a combination thereof.

After the ESL is formed, the ILD 56 may be formed over the ESL. The ILD 56 may be conformally deposited over the ESL. In an embodiment, the ILD 56 may comprise $SiO_2$, SiON, the like, or a combination thereof. The ILD 56 may be formed by CVD, ALD, PECVD, subatmospheric CVD (SACVD), flowable CVD, a high density plasma (HDP), a spin-on-dielectric process, the like, or a combination thereof. The ILD 56 may be planarized by using a chemical-mechanical polishing (CMP) process to remove portions of the ILD 56. In other embodiments, other planarization techniques may be used, such as etching.

In a gate-last embodiment, the gate electrode 40 and the gate dielectric may be dummy gate structure and may be removed and an active gate and gate dielectric is formed in the place of the removed gate electrode 40 and gate dielectric.

The source/drain contacts 52 and 54, and gate contacts (not shown) to the gate contact pads 40A and inter-metal dielectrics (IMD) (not shown) and their corresponding metallizations may be formed through the ESL and ILD 56 to the fins 36 and the gate electrodes 40. The source/drain contacts 52 and 54 and the gate contacts may be formed of copper, tungsten, aluminum, the like, or combinations and alloys thereof.

FIGS. 3A-B, 4A-B, 5A-B, 6A-B, 7A-B, 8A-B, and 9A-B are plan views and cross-sectional views of intermediate stages in the manufacturing of FinFETs in accordance with some embodiments.

Figure 3A:
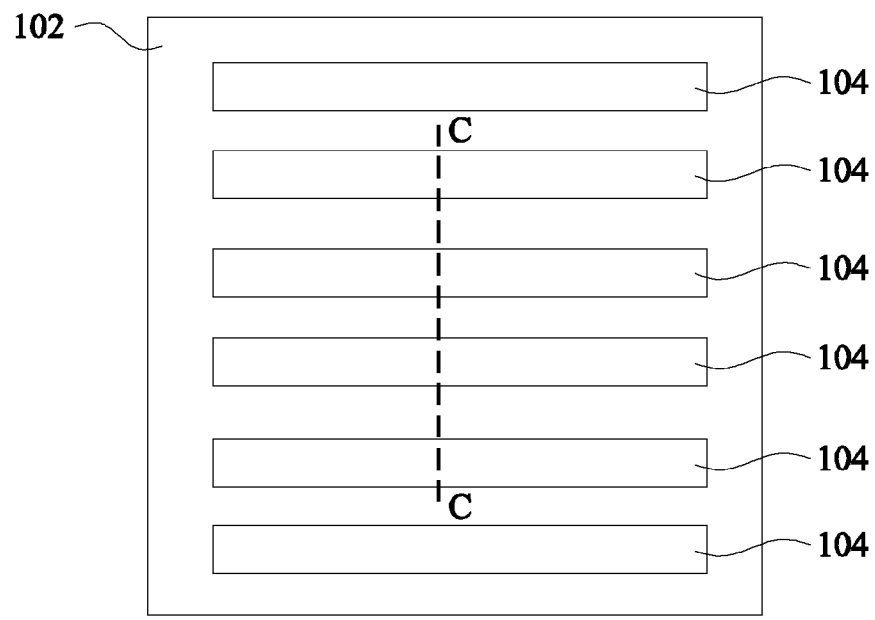
FIGS. 3A-B, 4A-B, 5A-B, 6A-B, 7A-B, 8A-B, and 9A-B are plan views and cross-sectional views of intermediate stages in the manufacturing of FinFETs in accordance with some embodiments.
Figure 3B:
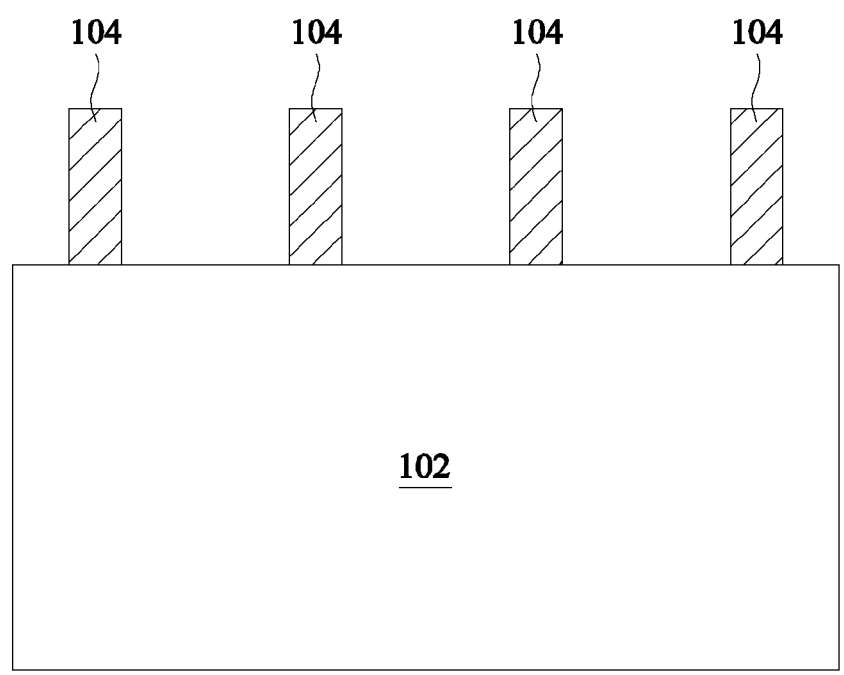

FIGS. 3A and 3B illustrate a substrate 102 and a patterned mask layer 104 over the substrate 102. FIGS. 3A and 3B are a plan view and a cross-sectional view, respectively, of an intermediate step in the formation of a FinFET in accordance with some embodiments with FIG. 3B being a cross-sectional view along the cross-section C-C in FIG. 3A. The substrate 102 may be a semiconductor substrate, such as a bulk semiconductor, a SOI substrate, or the like, which may be doped (e.g., with a p-type or an n-type dopant) or undoped. The substrate 102 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 32 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The patterned mask layer 104 may be formed and patterned over the substrate 102. The patterned mask layer 104 may be a photoresist, a hard mask, combinations thereof, or multi-layers thereof. The portions of the patterned mask layer 104 may be referred to as mandrels 104 as they will be used to form spacers in a double-patterning technique. In an embodiment, the mandrels 104 have longitudinal axes that are substantially parallel to each other.

Figure 4A:
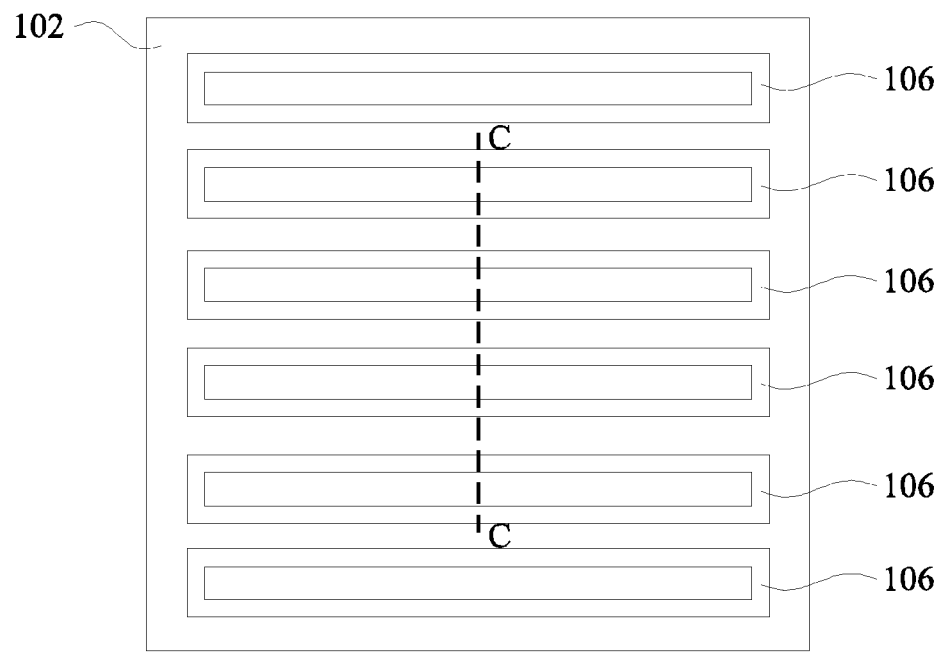
Figure 4B:
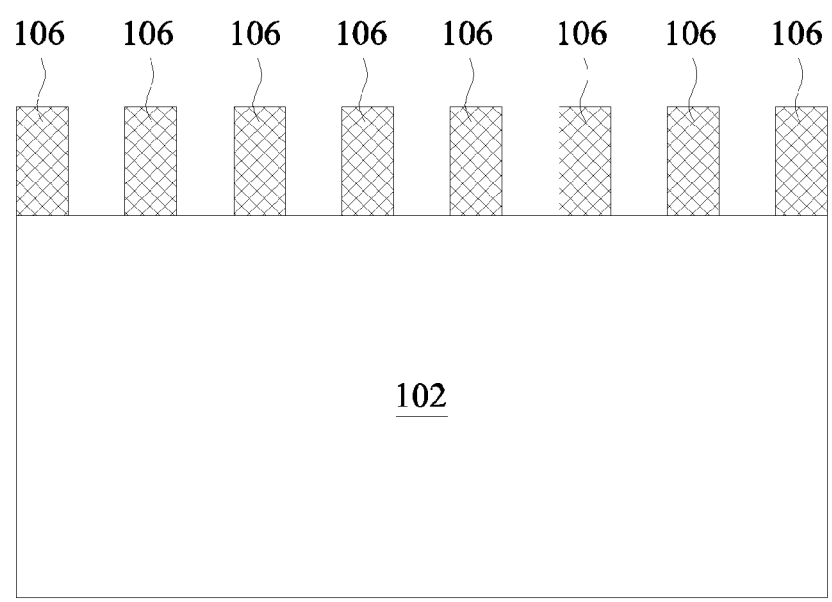

FIGS. 4A and 4B are similar views to FIGS. 3A and 3B and illustrate spacers 106 after the removal of the mandrels 104. The spacers 106 may be formed opposing sidewalls of the mandrels 104 with the mandrels 104 being subsequently removed. The spacers 106 may be formed by blanket depositing a spacer layer (not shown) on the mandrels 104 and the substrate 102. In an embodiment, the spacers 106 are formed of SiN, oxynitride, SiC, SiON, oxide, combinations thereof, or the like and may be formed by methods utilized to form such a layer, such as CVD, plasma enhanced CVD, sputter, the like, or a combination thereof. The spacers 106 are then patterned, for example, by anisotropically etching to remove the spacer layer from the horizontal surfaces of the structure. After the spacers 106 are formed, a selective etch process may be performed to remove the mandrels 104 from between the pairs of spacers 106 to form the pattern of the spacers 106.

Figure 5A:
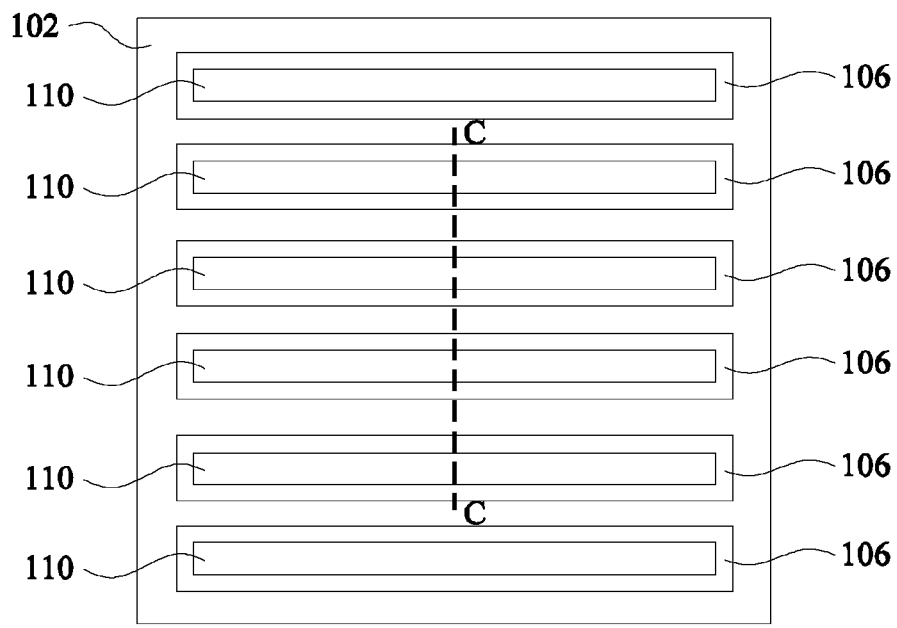
Figure 5B:
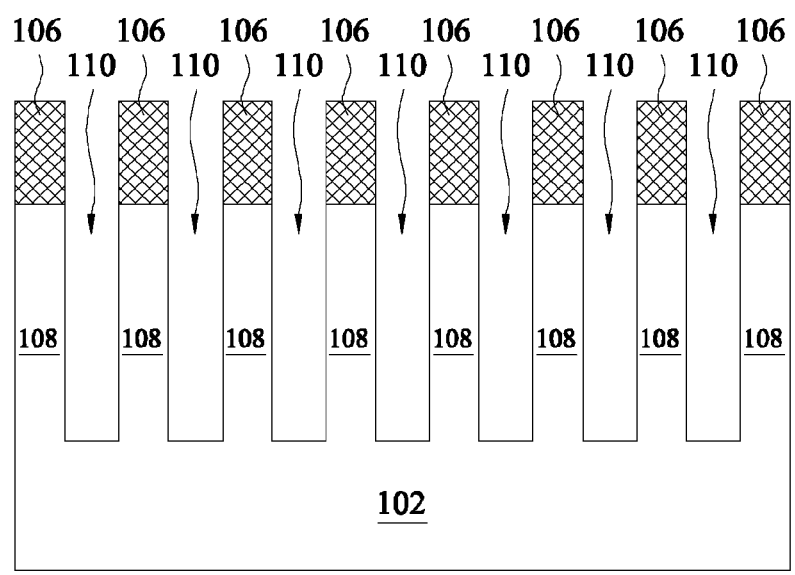

FIGS. 5A and 5B are similar views to FIGS. 3A and 3B and illustrate the formation of fins 108 extending from the substrate 102. The pattern of the spacers 106 is transferred to the substrate 102 to form the fins 108. The substrate 102 may be etched by an anisotropic etch process such as a dry etch process although any suitable etch process may be utilized. The etch process forms trenches 110 between the fins 108, and isolation regions, such as shallow trench isolation (STI) regions may be subsequently formed in these trenches 110. The trenches 110 have longitudinal axes that are substantially parallel to the longitudinal axes of the fins 108.

Figure 6A:
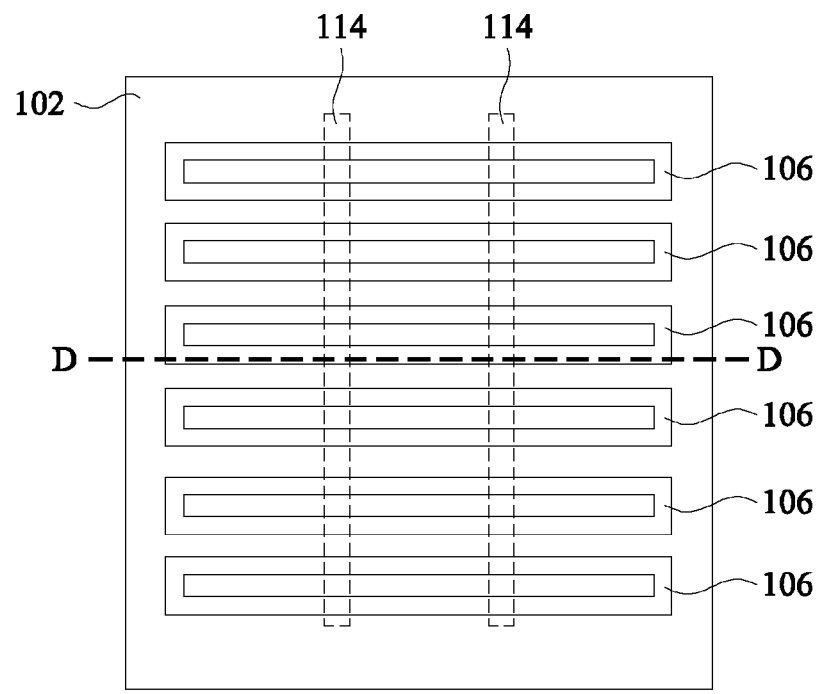
Figure 6B:
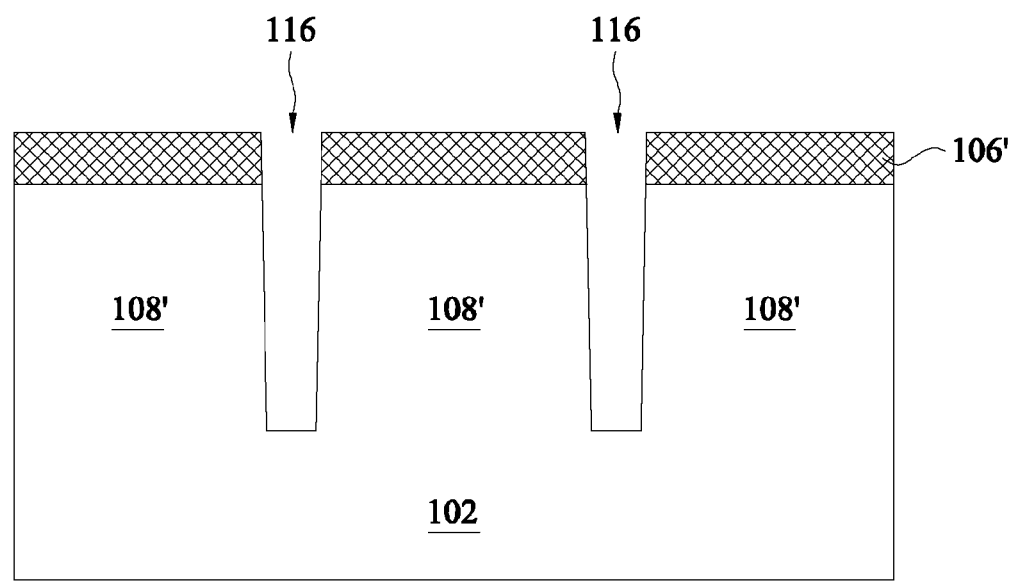

FIG. 6A illustrates portions 114 to pattern of the spacers 106 and the underlying fins 108 and FIG. 6B illustrates the formation of fin isolation trenches 116 in the spacers 106 and the fins 108 by patterning the portions 114 and forming patterned spacers 106' and fin portions 108'. FIGS. 6A and 6B are a plan view and a cross-sectional view, respectively, with FIG. 6B being a cross-sectional view along the cross-section D-D in FIG. 6A.

The patterning of the portions 114 may utilize a mask, such as a photoresist, a hard mask, combinations thereof, or multi-layers thereof. In some embodiments, the mask covers all of the structures on the substrate 102 except for the portions 114. In these embodiments, the patterning of the portions 114 may be performed by an anisotropic etch process such as a dry etch process although any suitable etch process may be utilized. The etch process forms fin isolation trenches 116 between the fin portions 108' and fin isolation regions (see 46 in FIGS. 2A and 2B) may be subsequently formed in these fin isolation trenches 116. In this embodiment, each of the fins 108 are divided into three, separate fin portions 108' by the fin isolation trenches 116. Throughout this disclosure, the patterning step that forms the fin isolation trenches 116 may be referred to as the fin isolation step.

Figure 7A:
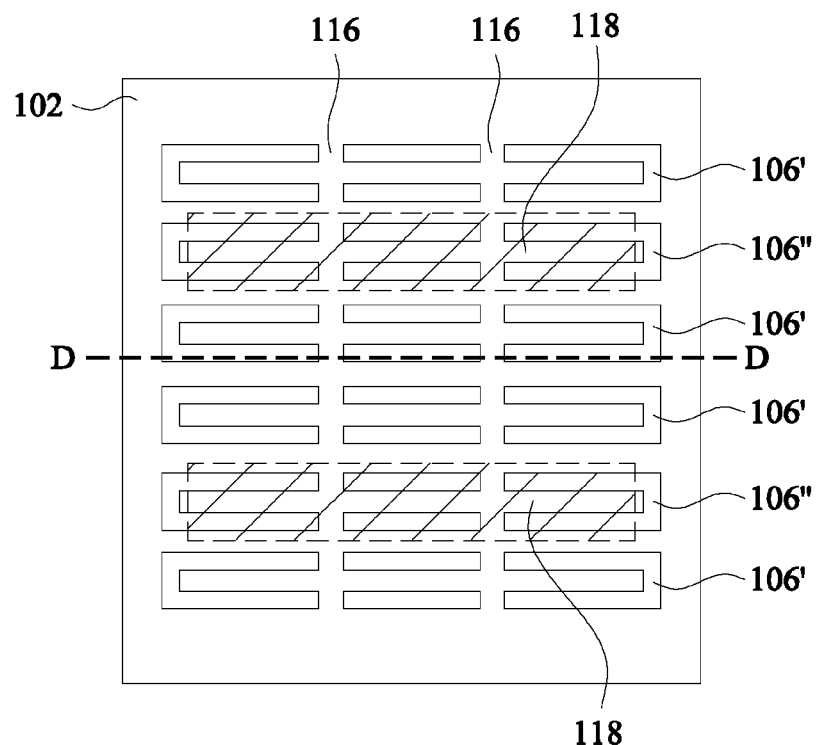
Figure 7B:
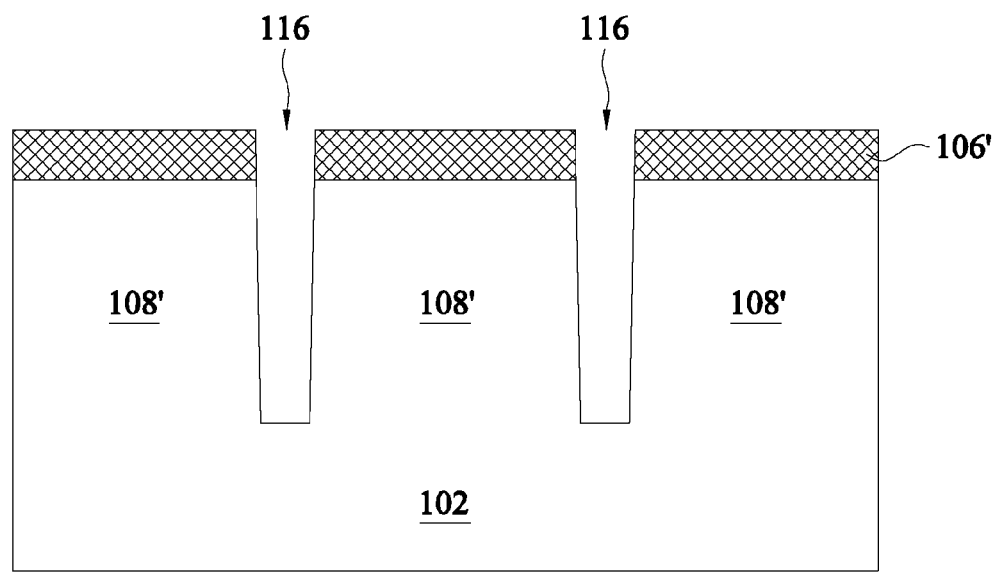

FIGS. 7A and 7B are similar views to FIGS. 6A and 6B and illustrate portions 118 to pattern of the patterned spacers 106' and the fin portions 108'. Patterning the portions 118 of the patterned spacers 106' and the fin portions 108' removes central portions of some of the fins 108 (now divided into fin portions 108'). In the illustrated embodiment, the portions to pattern 118 will remove central portions of four fins 108. The patterning of the portions 118 may utilize a mask, such as a photoresist, a hard mask, combinations thereof, or multi-layers thereof. In some embodiments, the mask covers all of the structures on the substrate 102 except for the portions 118. In these embodiments, the patterning of the portions 118 may be performed by an anisotropic etch process such as a dry etch process although any suitable etch process may be utilized.

Figure 8A:
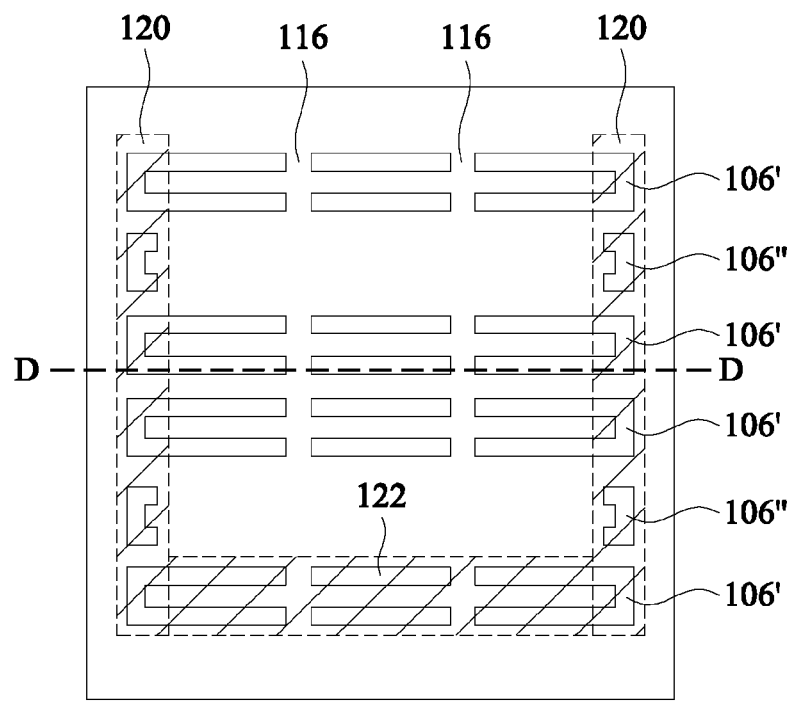
Figure 8B:
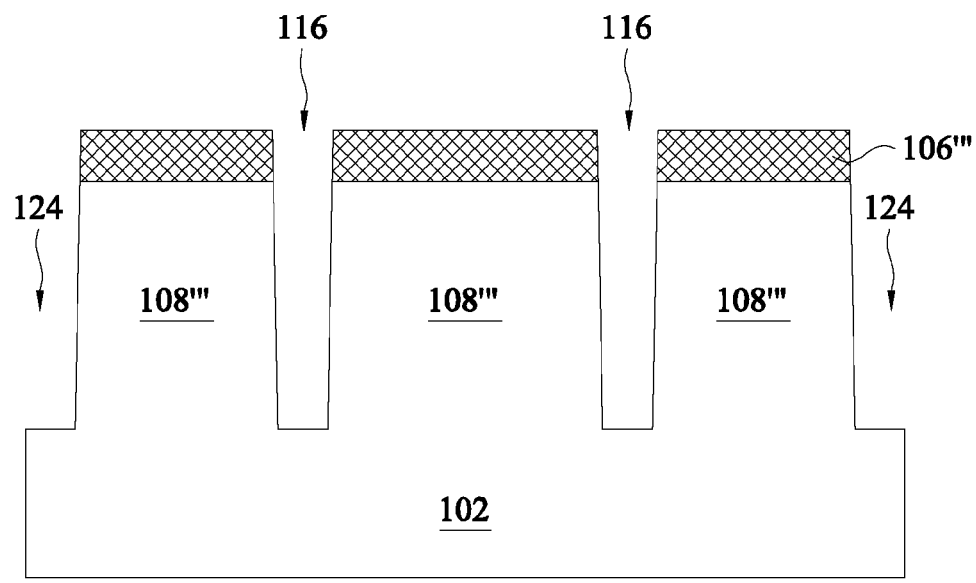

FIGS. 8A and 8B are similar views to FIGS. 6A and 6B and illustrate portions 120 and 122 to pattern of the patterned spacers 106' and 106" and the fin portions 108' and 108". Patterning the portions 120 of the patterned spacers 106' and 106" and the fin portions 108' and 108" removes end portions of the fins 108 (now divided into fin portions 108' and 108"). In the illustrated embodiment, the portions to pattern 120 will remove end portions of all of the fins 108. Patterning the portion 122 of the patterned spacers 106' removes central portions of some of the fins 108. In the illustrated embodiment, the portion to pattern 122 will remove central portions of two fins 108.

The patterning of the portions 120 and 122 may utilize a mask, such as a photoresist, a hard mask, combinations thereof, or multi-layers thereof. In some embodiments, the mask covers all of the structures on the substrate 102 except for the portions 120 and 122. In these embodiments, the patterning of the portions 120 and 122 may be performed by an anisotropic etch process such as a dry etch process although any suitable etch process may be utilized. The etch process forms trenches 124 on the ends of the outer fin portions 108''' and isolation regions (see 60 in FIGS. 2A and 2B) may be subsequently formed in these trenches 124.

Figure 9A:
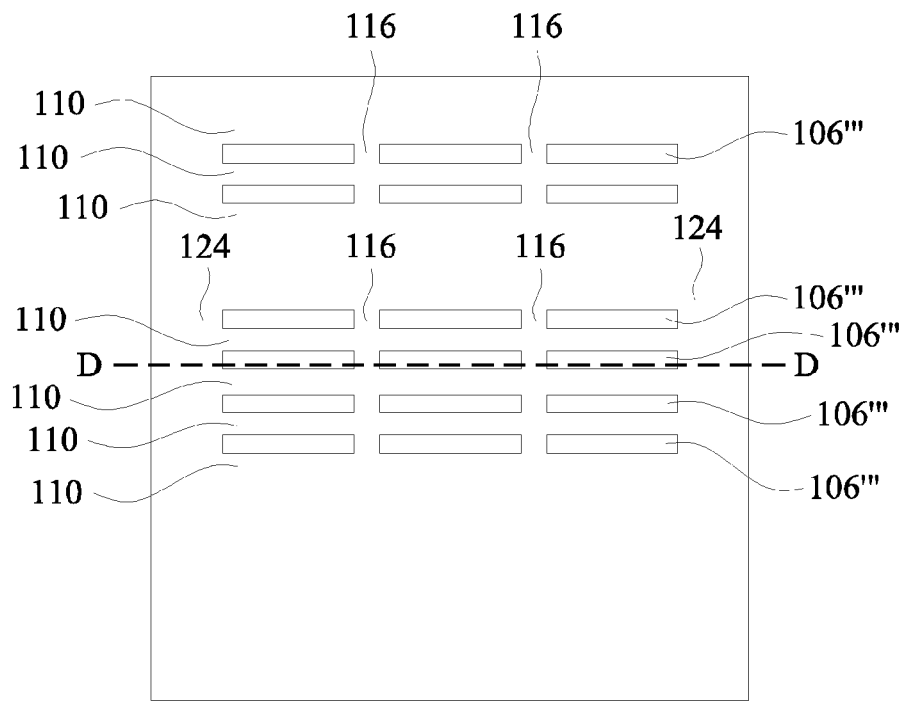
Figure 9B:
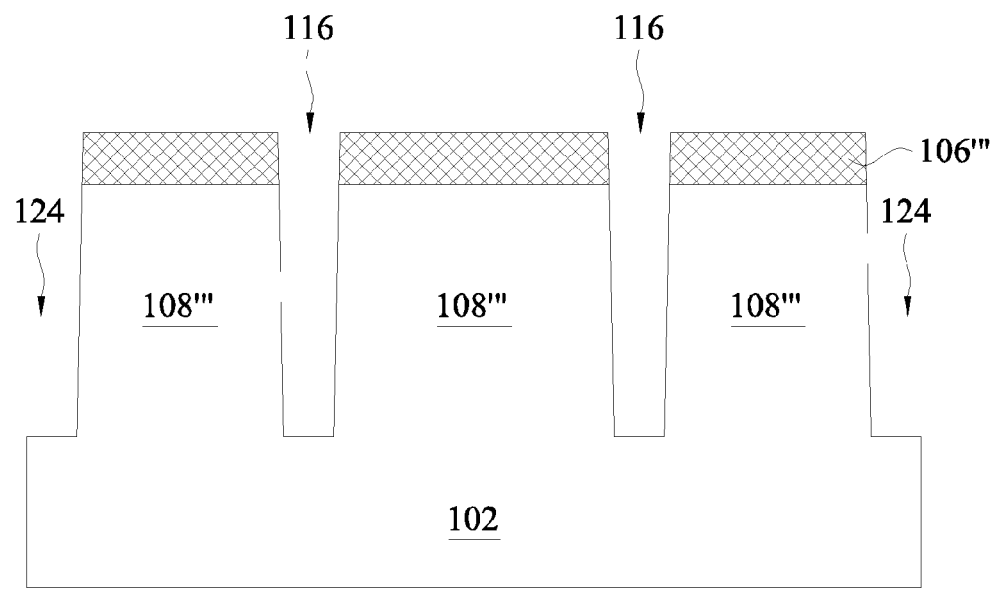

FIGS. 9A and 9B are similar views to FIGS. 6A and 6B and illustrate the patterned spacers 106''' and the fin portions 108''' after the removal of the portions 120 and 122. In the illustrated embodiment, there is a group of two fins 108 and a group of four fins 108, although other arrangements of the fins 108 are within the scope of this disclosure. The two fin isolation trenches 116 and the three of fin portions 108' is only illustrative and it is within the scope of the present disclosure to have more or less than two fin isolation regions and three fin portions.

Although not explicitly shown, a person having ordinary skill in the art will readily understand that further processing steps may be performed on the structure illustrated in FIGS. 9A and 9B. For example, the patterned spacers 106''' may be removed and fin isolation regions (see 46 in FIGS. 2A and 2B) may be formed in the fin isolation trenches 116 and isolation regions (see 60 in FIGS. 2A and 2B) may be formed in the trenches 124. In addition, gate electrodes, dummy gate electrodes, source/drain regions, gate spacers, contacts, ILDs, and other structures illustrated in FIGS. 2A and 2B may be subsequently formed on the structure in FIGS. 9A and 9B to provide a functional FinFET device.

Figure 10A:
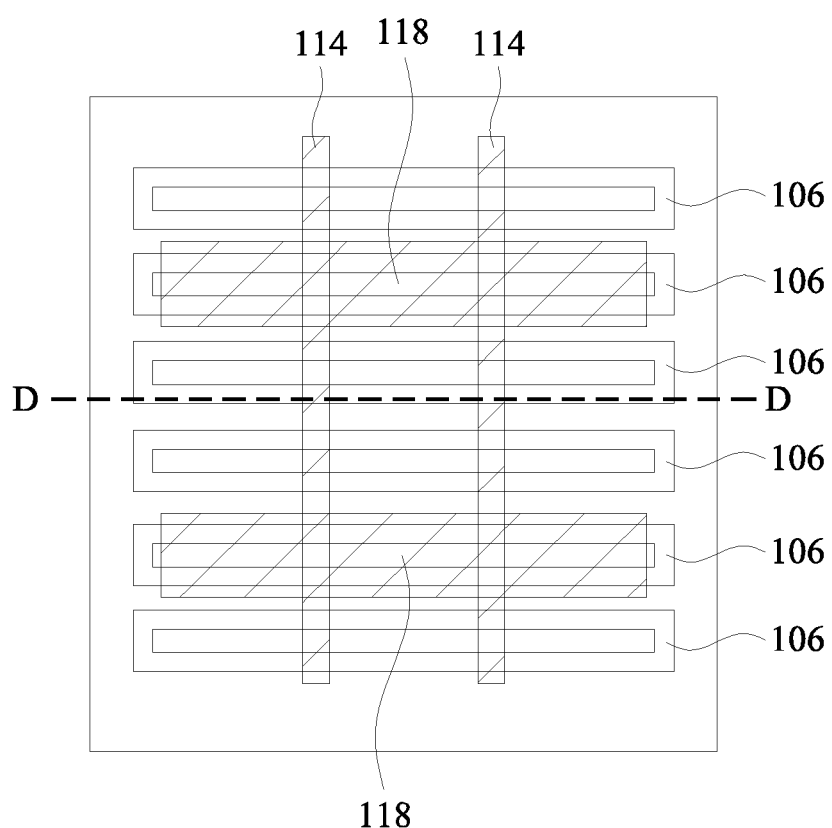
FIGS. 10A and 10B are plan views of intermediate stages in the manufacturing of FinFETs in accordance with some embodiments.
Figure 10B:
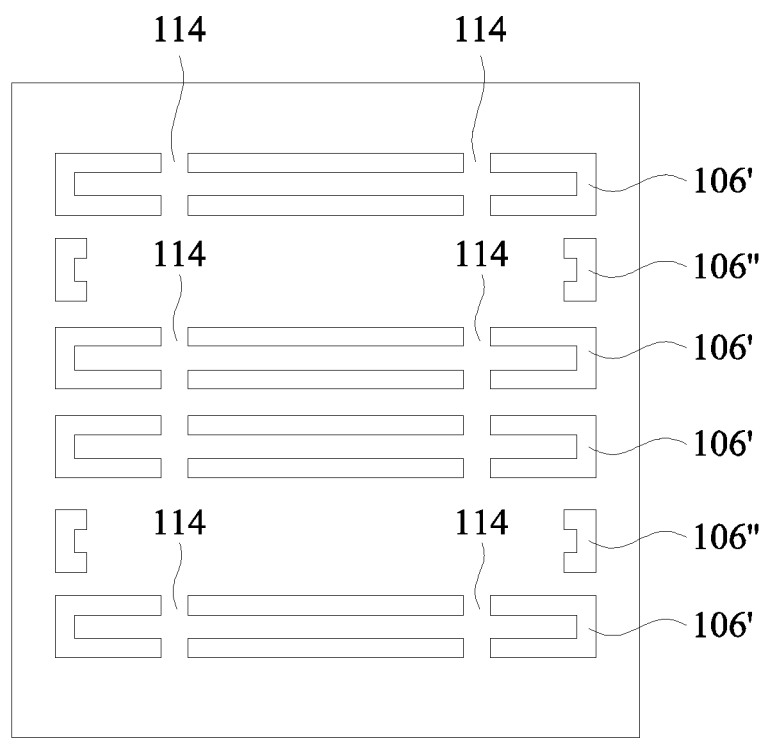

FIGS. 10A and 10B are plan views of intermediate stages in the manufacturing of FinFETs in accordance with another embodiment. This embodiment is similar to the previous embodiment described in FIGS. 3A-9B except that the fin isolation step is combined with another one of the patterning steps. Details of this embodiment that are similar to those of the previous embodiment described above are not repeated herein.

In this embodiment, the fin isolation step using the portions 114 to pattern (see FIGS. 6A-B) is combined with the patterning step using the portions to pattern 118 (see FIGS. 7A-B above). This embodiment utilizes fewer patterning steps by combining the masks of the two steps into a single mask and patterning step, which saves cost in the processing of the structure and also increases the throughput of the process.

Figure 11A:
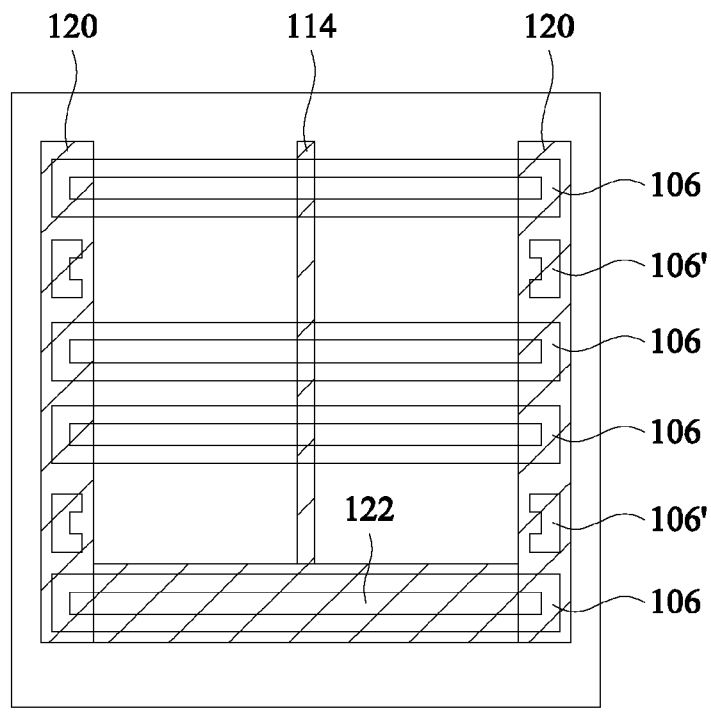
FIGS. 11A and 11B are plan views of intermediate stages in the manufacturing of FinFETs in accordance with some embodiments.
Figure 11B:
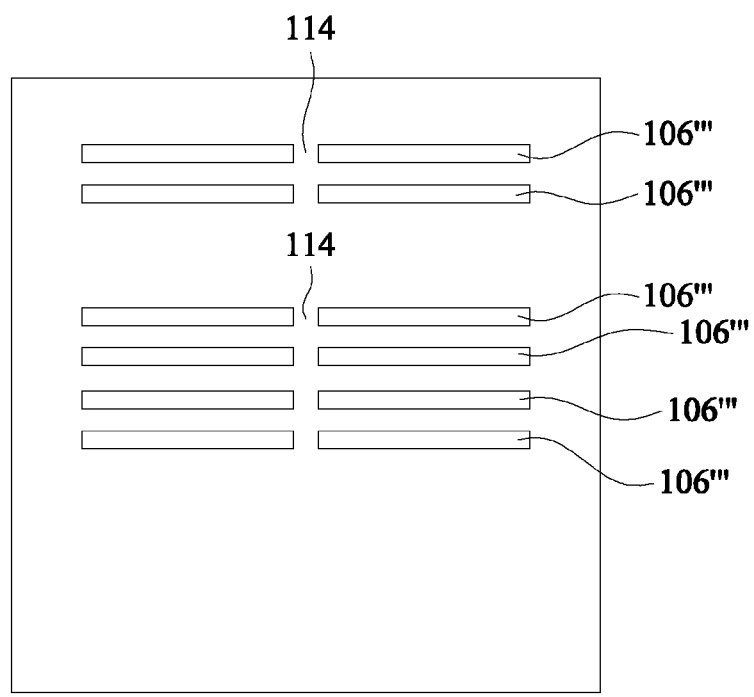

FIGS. 11A and 11B are plan views of intermediate stages in the manufacturing of FinFETs in accordance with another embodiment. This embodiment is similar to the previous embodiment described in FIGS. 10A-B except that the fin isolation step is combined with a different one of the patterning steps and there is only a single portion 114 to divide the fins 108 into two fin portions 108' as opposed two portions 114 to divide the fin 108 into three fin portions 108' as described above. Details of this embodiment that are similar to those of the previous embodiment described above are not repeated herein.

In this embodiment, the fin isolation step using the portions 114 to pattern (see FIGS. 6A-B) is combined with the patterning step using the portions to pattern 120 and 122 (see FIGS. 8A-B above). This embodiment also utilizes fewer patterning steps by combining the masks of the two steps into a single mask and patterning step, which saves cost in the processing of the structure and also increases the throughput of the process.

Figure 12A:
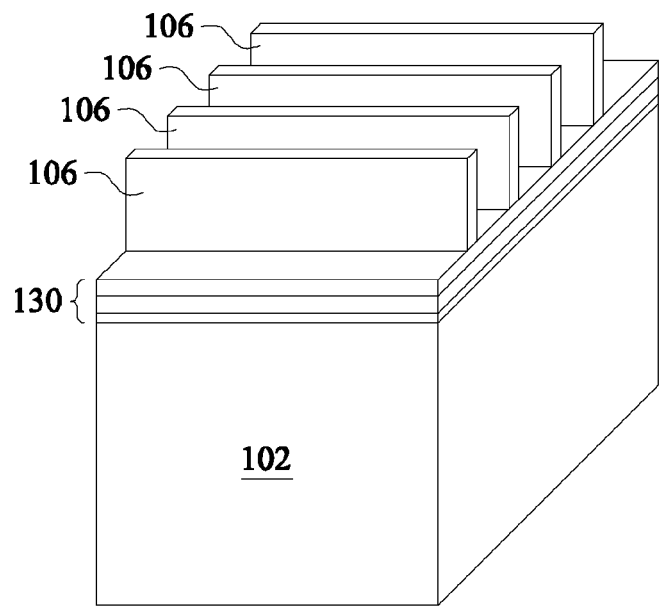
FIGS. 12A-C are three-dimensional views of intermediate stages in the manufacturing of FinFETs in accordance with some embodiments.
Figure 12B:
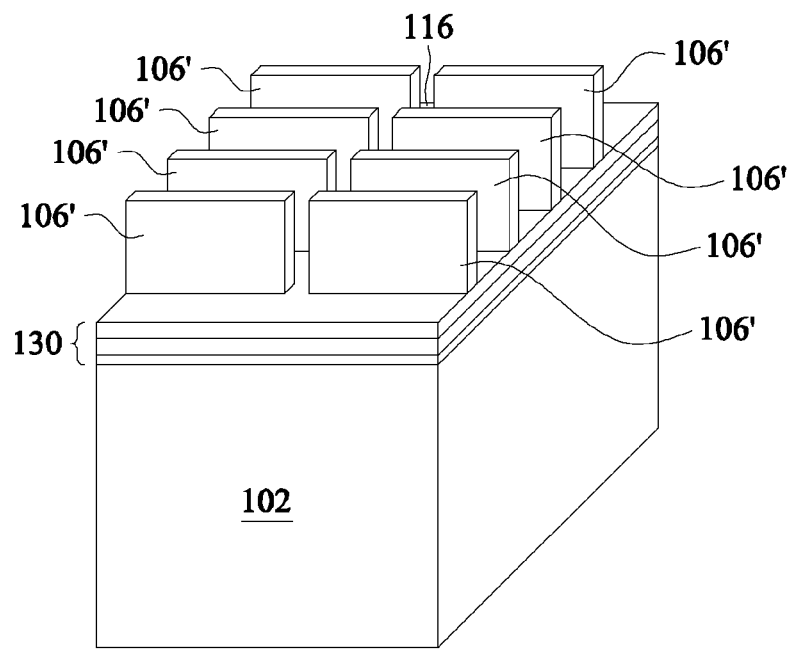
Figure 12C:
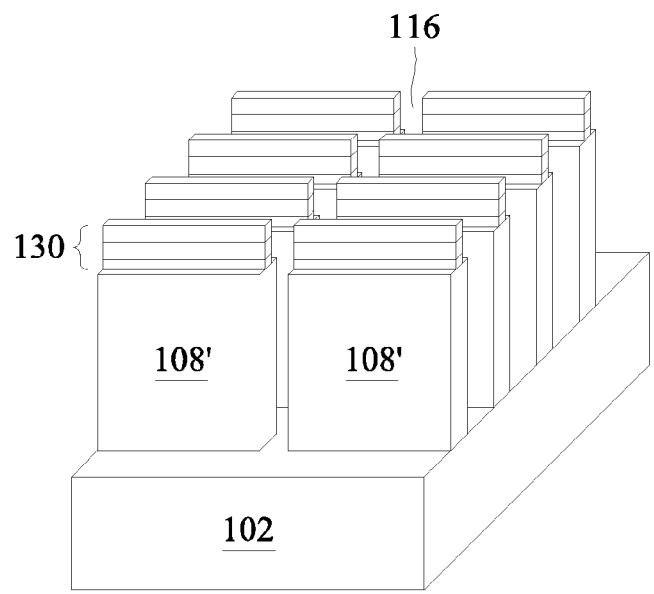

FIGS. 12A-C are three-dimensional views of intermediate stages in the manufacturing of FinFETs in accordance with some embodiments. This embodiment is similar to the previous embodiment described in FIGS. 3A-9B except that the fin isolation step is performed on the spacers 106 before the spacers 106 are used to form the fins 108. Details of this embodiment that are similar to those of the previous embodiment described above are not repeated herein.

In this embodiment, the fin isolation step (see FIGS. 6A-B) is performed on the spacers 106 before the fins 108 are formed. In FIG. 12A, the spacers 106 are formed over a mask layer 130 and the substrate 102. In some embodiments, the mask layer 130 includes multiple layers such as a buffer oxide layer on the substrate 102, a nitride mask layer on the buffer oxide layer, and an oxide hard mask layer on the nitride mask layer. Only a portion of the spacers 106 and the substrate are shown in FIG. 12-C as this portion is sufficient to describe this embodiment.

In FIG. 12B, the fin isolation step is performed on the spacers 106 to divide the spacers 106 into separate patterned spacers 106' (also referred to as spacer portions 106'). The fin isolation step may be an etch process such as an anisotropic etch process although any suitable etch process may be utilized. The etch process forms the fin isolation trench 116 between adjacent spacer portions 106'. In FIG. 12C, the spacer portions 106' are used to pattern the mask layer 130 and the substrate 102 to transfer the fin isolation trench 116 to the substrate 102 to form fin portions 108'. This embodiment may allow for the capability of a smaller fin isolation trench 116 than the previous embodiments. A main reason that this embodiment is capable of a smaller fin isolation trench 116 is the difference in the thickness of the layer(s) to be etched with the initial formation of fin isolation trench 116.

Figure 13A:
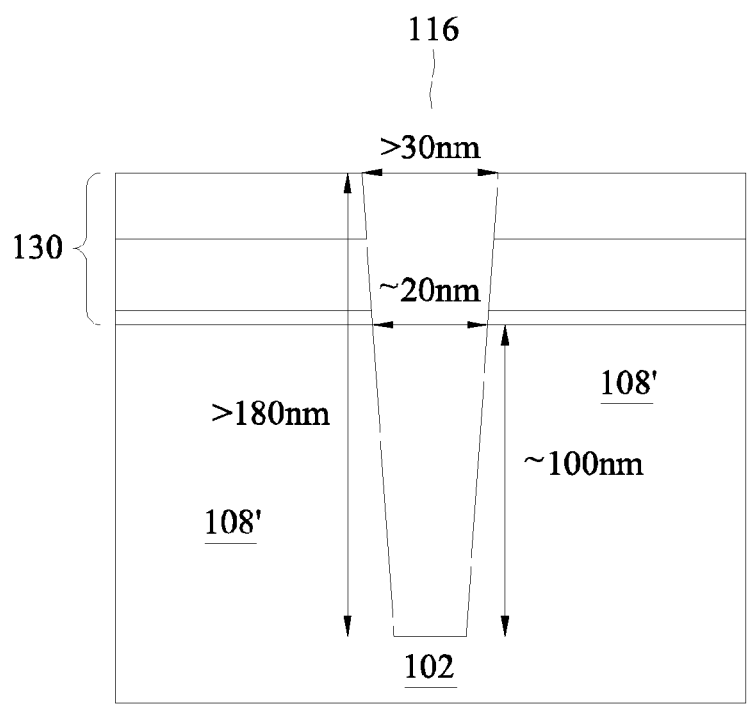
FIGS. 13A-B are cross-sectional views of fin isolation trench profiles in accordance with various embodiments.
Figure 13B:
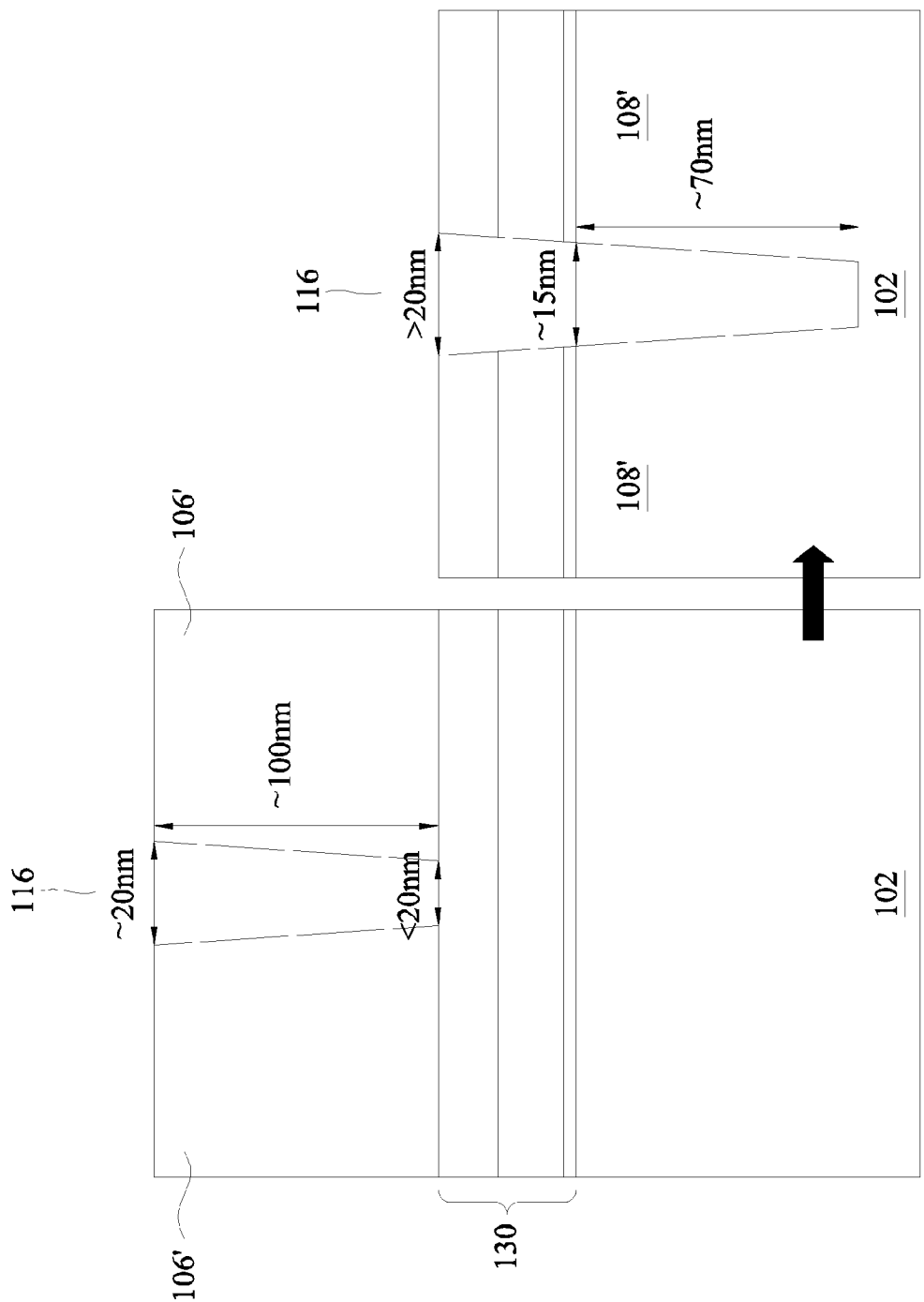

FIGS. 13A and 13B illustrate the differences in the fin isolation trench etch profiles with FIG. 13A illustrating the embodiments of FIGS. 3A-11B and FIG. 13B illustrating the embodiment of FIGS. 12A-C. As illustrated in FIG. 13A, the etch to form the fin isolation trench 116 (e.g. FIG. 6B) must etch through the spacers 106, any mask layers between the substrate and the spacers 106 (e.g. similar to mask layer 130), and a portion of the substrate 102. In a specific embodiment, this total thickness of material to be etched is about 180 nm. As compared to FIG. 13B, where just the spacers 106 are used to form the initial fin isolation trench 116 (e.g. FIG. 12B). In a specific embodiment, the thickness of the spacers 106 to be etched is about 100 nm. Hence, in the embodiment of FIG. 13A, to have fin isolation trench 116 with a width of about 20 nm at a top surface of the fin portions 108', the opening at the top of the mask layer 130 (may also include spacers 106 of FIG. 6B) will be greater than about 30 nm. In the embodiment of FIG. 13B, the same aspect ratio of fin isolation trench 116 should have a width of about 20 nm at a top of the spacers 106 which will then have an opening of less than 20 nm at the top surface of the fin portions 108'. In a specific embodiment of the embodiment of FIGS. 12A-C, the fin isolation trench 116 may have a width less than 20 nm, such as about 15 nm, at a top surface of the fin portions 108', and may have a depth of about 70 nm from the top surface of the fin portions 108' to the bottom of the fin isolation trench 116.

Figure 14:
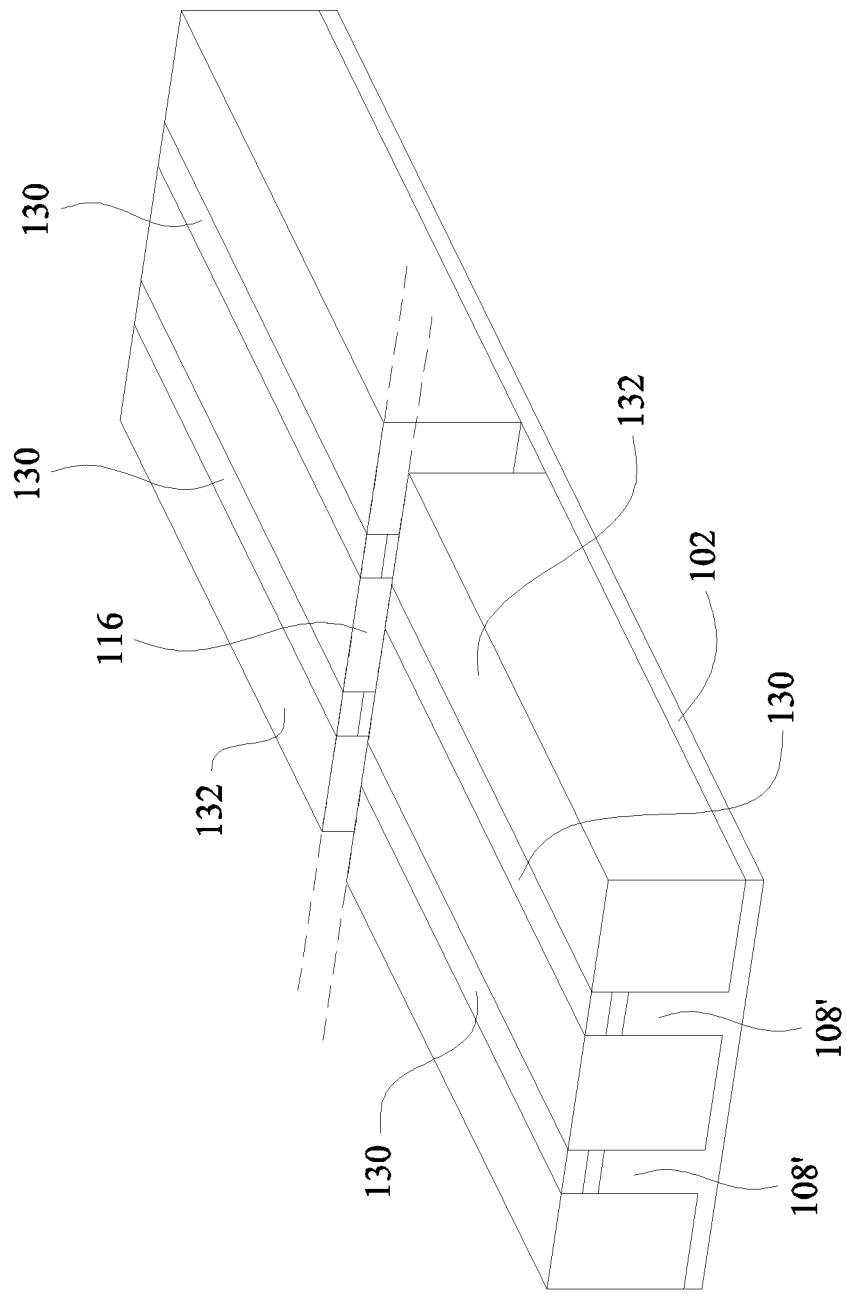
FIG. 14 is a three-dimensional view of an intermediate stage in the manufacturing of FinFETs in accordance with some embodiments.

FIG. 14 is a three-dimensional view of an intermediate stage in the manufacturing of FinFETs in accordance with some embodiments. This embodiment is similar to the previous embodiment described in FIGS. 3A-9B except that the fin isolation step is performed after fins 108 and STI regions 132 are formed and planarized. Details of this embodiment that are similar to those of the previous embodiment described above are not repeated herein.

In this embodiment, the fins 108 may be formed as described above in FIGS. 2A-B and are surrounded by isolation regions 132 (also referred to as STI regions 132). The fins have the patterned mask layer 130 over top surfaces of each of the fins 108. After the formation and planarization of the STI regions 132 and the fins 108, the fin isolation step is performed to form the fin isolation trench 116 which divides the fins 108 into fin portions 108'.

Each of the embodiments in FIGS. 11A-14 may undergo further processing steps on their respective structures. For example, each of these structures may have further processing to include the structures in FIGS. 2A-C.

By forming the fin isolation regions in the fins, the fin isolation regions divide a single fin into several fin portions. The fin isolation regions isolate the separate fin portions to allow the devices (e.g. transistors, gate electrodes, source/drain regions, etc.) to operate independently of each other such that more independent devices may be formed in a smaller area. The fin isolation regions may be formed in separate patterning steps or may be combined with other patterning steps such that they do not require additional lithography and etching steps. The width of the fin isolation regions may be less than the gate pitch of the structure. It has been discovered that this fin isolation approach saves approximately 3% of substrate space in a device/die at the 16 nm technology node as compared to other approaches.

An embodiment is a method including forming a first fin on a substrate, the first fin having a first longitudinal axis, forming a first trench having a first width in the first fin, the first trench dividing the first fin into at least two fin portions, forming a first gate structure and first source/drain regions over one of the at least two fin portions of the first fin, and forming a second gate structure and second source/drain regions over another of the at least two fin portions of the first fin.

Another embodiment is a method including patterning a mask layer over a substrate to form strips with substantially parallel longitudinal axes, forming spacers on sidewalls of the strips of the patterned mask layer, the spacers having longitudinal axes substantially parallel to the longitudinal axes of the strips of the patterned mask layer, removing the strips of the patterned mask layer, patterning the substrate using the spacers as a mask to form a plurality of fins underlying the spacers and first trenches separating the plurality of fins from each other, forming a second trench having a first width in the spacers, the first trench having a longitudinal axis that is substantially perpendicular to the longitudinal axes of the spacers, forming a third trench having a second width in first ends of the spacers and the plurality of fins, and forming a fourth trench having a third width in second ends of the spacers and the plurality of fins, the second ends being opposite the first ends.

A further embodiment is a structure including a fin on a substrate, the fin having a first portion and a second portion, the first portion being collinear with the second portion, a first isolation region in the fin, first isolation region interposed between the first and second portions of the fin, the first isolation region having a first width measured in a direction substantially parallel to a longitudinal axis of the fin, a second isolation region adjoining longitudinal sidewalls of the fin, a first dummy gate structure on the first isolation region, a first active gate structure on a top surface and sidewalls of the first portion of the fin, and a second active gate structure on a top surface and sidewalls of the second portion of the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   patterning a mask layer over a substrate to form strips with substantially parallel longitudinal axes;
   forming spacers on sidewalls of the strips of the patterned mask layer, the spacers having longitudinal axes substantially parallel to the longitudinal axes of the strips of the patterned mask layer;
   removing the strips of the patterned mask layer;
   patterning the substrate using the spacers as a mask to form a plurality of fins underlying the spacers and first trenches separating the plurality of fins from each other, the first trenches having longitudinal axes substantially parallel to the longitudinal axes of the spacers;
   forming a second trench having a first width in the spacers, the second trench having a longitudinal axis that is substantially perpendicular to the longitudinal axes of the first trenches in a plan view, the second trench forming an isolation region having the first width in each of the spacers;
   forming a third trench having a second width in first ends of the spacers and the plurality of fins; and
   forming a fourth trench having a third width in second ends of the spacers and the plurality of fins, the second ends being opposite the first ends.

2. The method of claim 1, wherein the first width is less than the second width and the third width.

3. The method of claim 1 further comprising:
   forming the second trench having the first width in the plurality of fins;
   removing the spacers; and
   forming a dielectric material in the first trenches, the second trench, the third trench, and the fourth trench.

4. The method of claim 3 further comprising:
   forming a first active gate structure on top surfaces and sidewalls of the plurality of fins and top surfaces of the first trenches, the first active gate structure being between the second trench and the third trench;
   forming a first set of source/drain regions in the plurality of fins on opposing sides of the first active gate structure, the first set of source/drain regions being between the second trench and the third trench;
   forming a second active gate structure on top surfaces and sidewalls of the plurality of fins and top surfaces of the first trenches, the second active gate structure being between the second trench and the fourth trench;
   forming a second set of source/drain regions in the plurality of fins on opposing sides of the second active gate structure, the second set of source/drain regions being between the second trench and the fourth trench; and
   forming a first dummy gate structure on the dielectric material in the second trench.

5. The method of claim 4 further comprising:
   forming a second dummy gate structure partially on the dielectric material in the third trench and partially on the plurality of fins; and
   forming a third dummy gate structure partially on the dielectric material in the fourth trench and partially on the plurality of fins.

6. The method of claim 4, wherein the first width of the second trench is less than a gate pitch between the first active gate structure and the first dummy gate structure.

7. A method comprising:
forming a fin on a substrate, the fin having a first portion and a second portion, a longitudinal axis of the first portion being collinear with a longitudinal axis of the second portion;
forming a first isolation region in the fin, first isolation region interposed between the first and second portions of the fin, the first isolation region having a first width measured in a direction substantially parallel to the longitudinal axes of the first and second portions of the fin;
forming a first dummy gate structure on the first isolation region;
forming a first active gate structure on a top surface and sidewalls of the first portion of the fin; and
forming a second active gate structure on a top surface and sidewalls of the second portion of the fin.

8. The method of claim 7 further comprising:
forming a second isolation region on a first end of the fin, the second isolation region having a second width measured in a direction substantially parallel to a longitudinal axis of the fin;
forming a third isolation region on a second end of the fin, the third isolation region having a third width measured in a direction substantially parallel to a longitudinal axis of the fin, the second end of the fin being opposite the first end of the fin;
forming a second dummy gate structure partially on the second isolation region and partially on the fins; and
forming a third dummy gate structure partially on the third isolation region and partially on the fin.

9. The method of claim 8, wherein the second width is larger than the first width, and the third width is larger than the first width.

10. The method of claim 7, wherein forming the first isolation region comprises:
forming a trench in the fin, sidewalls of the first dummy gate structure aligned with sidewalls of the trench, the trench having a longitudinal axis substantially perpendicular to the longitudinal axes of the first and second portions of the fin.

11. A method comprising:
forming a first fin on a substrate, the first fin having a first portion and a second portion, a longitudinal axis of the first portion being collinear with a longitudinal axis of the second portion;
forming a first isolation region in the first fin, first isolation region interposed between the first and second portions of the first fin, the first isolation region having a first width measured in a direction substantially parallel to the longitudinal axes of the first and second portions of the first fin;
forming a first dummy gate structure on the first isolation region;
forming a first active gate structure on a top surface and sidewalls of the first portion of the first fin, a gate pitch between the first active gate structure and the first dummy gate structure being greater than the first width of the first isolation region; and
forming a second active gate structure on a top surface and sidewalls of the second portion of the first fin.

12. The method of claim 11, wherein forming the first isolation region comprises:
forming a first trench in the first fin, sidewalls of the first dummy gate structure aligned with sidewalls of the first trench.

13. The method of claim 12, further comprising:
forming a second fin on the substrate, the second fin having a second longitudinal axis, the second longitudinal axis being substantially parallel to the longitudinal axes of the first and second portions of the first fin;
forming the first trench having the first width in the second fin, the first trench dividing the second fin into at least two fin portions;
forming the first active gate structure and first source/drain regions over one of the at least two fin portions of the second fin; and
forming the second active gate structure and second source/drain regions over another of the at least two fin portions of the second fin.

14. The method of claim 12, further comprising:
forming a second trench in a first end of the first fin and a third trench in a second end of the first fin, the second end being opposite the first end, the second trench and the third trench each having second widths.

15. The method of claim 14, wherein the first width is smaller than the second width.

16. The method of claim 14, wherein the first trench has a first depth measured from a top surface of the first fin and the second and third trenches have a second depth measured from the top surface of the first fin, the first depth being smaller than the second depth.

17. The method of claim 14, wherein the step of forming the first trench and the steps of forming the second trench and the third trench are performed at a same time by a same process.

18. The method of claim 14, wherein the step of forming the first trench is performed before the steps of forming the second trench and the third trench.

19. The method of claim 14 further comprising:
forming a second dummy gate structure partially over the second trench and partially over the first fin; and
forming a third dummy gate structure partially over the third trench and partially over the first fin.

20. The method of claim 11, wherein forming the first fin on the substrate comprises:
patterning a mask layer over the substrate;
forming spacers on sidewalls of the mask layer; and
patterning the substrate using the spacers as a mask to form the first fin on the substrate.

* * * * *